(12) United States Patent
Hoke et al.

(10) Patent No.: US 6,489,639 B1
(45) Date of Patent: Dec. 3, 2002

(54) HIGH ELECTRON MOBILITY TRANSISTOR

(75) Inventors: William E. Hoke, Wayland; Peter J. Lemonias, North Andover, both of MA (US); Theodore D. Kennedy, Londonderry, NH (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/577,508

(22) Filed: May 24, 2000

(51) Int. Cl.$^7$ .......................................... H01L 31/0328
(52) U.S. Cl. ...................................................... 257/194
(58) Field of Search ................................. 257/183, 192, 257/194, 195

(56) References Cited

U.S. PATENT DOCUMENTS

| | | | |
|---|---|---|---|
| 5,633,516 A | | 5/1997 | Mishima et al. |
| 5,780,879 A | | 7/1998 | Unozawa |
| 5,811,844 A | * | 9/1998 | Kuo et al. ............... 257/194 |
| 5,844,261 A | * | 12/1998 | Kuo et al. ............... 257/194 |
| 5,847,409 A | | 12/1998 | Nakayama |
| 5,945,693 A | | 8/1999 | Suzuki et al. |
| 6,242,766 B1 | * | 6/2001 | Tateno ..................... 257/194 |
| 6,271,547 B1 | * | 8/2001 | Hoke et al. ............... 257/192 |

FOREIGN PATENT DOCUMENTS

WO    WO 00/54338    9/2000

OTHER PUBLICATIONS

Sang–Ki Hong, et al., "Molecular beam epitaxy growth of indium–rich...", Journal of Crystal Growth 169 (1996), pp. 435–442.

* cited by examiner

*Primary Examiner*—Olik Chaudhuri
*Assistant Examiner*—Hoa B. Trinh
(74) *Attorney, Agent, or Firm*—Daly, Crowley & Mofford, LLP

(57) ABSTRACT

A semiconductor structure, e.g., a high electron mobility transistor structure, is formed by using metamorphic growth and strain compensation. The structure includes a substrate, a graded layer over the substrate, a first donor/barrier layer over the graded layer, and a channel layer over the first donor/barrier layer. The substrate has a substrate lattice constant, and the graded layer has a graded lattice constant. The graded layer has a first lattice constant near a bottom of the graded layer substantially equal to the substrate lattice constant and a second lattice constant near a top of the graded layer different than the first lattice constant. The first donor/barrier layer has a third lattice constant, and the channel layer has a fourth lattice constant. The second lattice constant is intermediate the third and fourth lattice constants.

31 Claims, 6 Drawing Sheets

HIGH ELECTRON MOBILITY TRANSISTOR

BACKGROUND

The invention relates to semiconductor structures, particularly to high electron mobility transistors (HEMTs).

There are several types of field effect transistors (FETs) that can be used at microwave and millimeter wave frequencies. One of these FETs includes a high electron mobility transistor (HEMT), which can be formed from Group III-V materials such as gallium arsenide (GaAs) and indium phosphide (InP).

Generally, a HEMT includes a donor/barrier layer and a channel layer. The donor/barrier layer is generally a wide-band gap material, and the channel layer is generally a lower-band gap material. A heterojunction is typically formed between the donor/barrier and the channel layers. Due to a conduction band discontinuity at the heterojunction, electrons are injected from the donor/barrier layer into the channel layer. Electrons injected into the channel layer are confined to move in a plane parallel to the heterojunction due to the relatively larger bandgap of the donor/barrier layer. Consequently, there is a spatial separation between dopant atoms in the donor/barrier layer and electrons in the channel layer, which results in low impurity scattering and good electron mobility. It is generally desirable for HEMTs to have high power performances, high breakdown voltages, and high current densities.

As a channel layer in a transistor structure for microwave power and millimeterwave operations, InP has high saturated velocity, moderate mobility, and high breakdown field. However, InP has a low Schottky barrier height. Furthermore, using AlInP as a Schottky layer in a FET or as a donor/Schottky layer in a HEMT structure can be limited because elastic strain can limit the aluminum concentration of AlInP on InP substrates to approximately 15%. Consequently, the Schottky barrier and HEMT conduction band discontinuity may only be modestly improved. Elastic strain can also limit a HEMT structure to a single-sided AlInP/InP heterojunction because the combined tensile strain of having two AlInP layers in a double-sided AlInP/InP/AlInP HEMT could exceed elastic strain limits and cause device-degrading crystalline dislocations. Moreover, an additional limitation is growth on InP substrates which can be more expensive, smaller, and more fragile than GaAs substrates.

SUMMARY

In accordance with the invention, a double pulse doped semiconductor structure, e.g., a HEMT, having two $Al_xIn_{1-x}P$ donor/barrier layers and an InP channel layer is provided. Generally, the structure is formed by using metamorphic growth and strain compensation. A metamorphic graded layer and a relaxed buffer layer are formed on a first substrate, e.g., GaAs and InP, to provide a "new substrate" having a lattice constant different than the lattice constant of the first substrate. The lattice constant of the relaxed buffer layer is intermediate the lattice constants of the donor/barrier layers and the channel layer. When the donor/barrier layers and the channel layer are formed on the relaxed buffer layer, these layers develop strain due to the differences in lattice constants of these layers and the relaxed buffer layer. However, these strains compensate for each other to near equilibrium, thereby allowing the donor/barrier and channel layers to be formed with minimized crystalline dislocations. From a cross-sectional transmission electron microscope (TEM) micrograph, the layers of the structure exhibit good planarity and threading dislocations are not readily apparent. From plan view TEM micrographs, the dislocation density is estimated to be less than $1 \times 10^6$ $cm^{-2}$.

The structure of the invention includes an InP channel layer with good, practical thicknesses and two $Al_xIn_{1-x}P$ donor/barrier layers with relatively high aluminum concentrations that provide two AlInP/InP heterojunctions. By using strain-compensated AlInP/InP layers on top of a relaxed buffer layer provided by metamorphic growth, AlInP donor/barrier layers can be grown pseudomorphically with up to 40% aluminum concentration. This concentration is approximately twice that of some growth on InP substrates. Alloying aluminum into InP, up to about 40%, increases the bandgap of InP, e.g., from about 1.35 eV for InP to about 2.03 eV for $Al_{0.30}In_{0.70}P$. High bandgaps provide high breakdown characteristics, which allow high breakdown devices to be formed. Large bandgap donor/barrier layers also provide good charge transfer into the channel layer and good confinement of current in the channel layer. Increasing the aluminum concentration also increases the Schottky barrier height. Furthermore, the structure of the invention also includes heterojunctions, e.g., $Al_{0.30}In_{0.70}P/InP$, that have relatively high conduction band discontinuities between the channel layer and the donor/barrier layers. High conduction band discontinuity provides high current density and good charge confinement of current. Metamorphic grading also permits growth of this structure on GaAs substrates, which can be larger, less expensive, and more robust than InP substrates.

In one aspect, the invention features a semiconductor structure, e.g., a high electron mobility transistor structure, including a substrate, a graded layer, a first donor/barrier layer, and a channel layer. The, substrate (e.g., InP and GaAs) has a substrate lattice constant. The graded layer (e.g., $(AlGa)_{0.25}In_{0.75}P$) is disposed over the substrate and has a graded lattice constant, wherein the graded layer has a first lattice constant near a bottom of the graded layer substantially equal to the substrate lattice constant and a second lattice constant near a top of the graded layer different than the first lattice constant. The first donor/barrier layer (e.g., $Al_{0.30}In_{0.70}P$) is disposed over the graded layer and has a third lattice constant, and the channel layer (e.g., InP) is disposed over the first donor/barrier layer and has a fourth lattice constant. The second lattice constant is intermediate the third and fourth lattice constants. The structure can further include a relaxed buffer layer (e.g., $(AlGa)_{0.20}In_{0.80}P$) over the graded layer and having a fifth lattice constant intermediate the third and fourth lattice constants, e.g., larger than the third lattice constant.

Embodiments of the invention may include one or more of the following features. The second lattice constant is smaller than the first lattice constant and/or larger than the third lattice constant. The first donor/barrier layer is tensilely strained and the channel layer is compressively strained. The strains in the first donor/barrier layer and the channel layer are substantially at equilibrium. The lattice constant of a portion of the graded layer varies with distance from the substrate. The graded layer includes a Group III-V material having a Group III material with a first concentration of indium at the bottom of the graded layer higher than a second indium concentration at the top of the graded layer. The graded layer has a linearly varying indium concentration or a stepwise indium concentration. The difference between the second and third indium concentrations is between about 3 percentage points and about 8 percentage points, e.g., about 5 percentage points.

The first donor/barrier layer can include a Group III–V material having a Group III material with a fourth indium concentration lower than the second indium concentration. The first donor/barrier layer includes a Group III–V material having a Group III material with an aluminum concentration between about 23% and about 40%. The channel layer has a thickness of about 80 Å to about 130 Å.

The structure can further include over the channel layer a second donor/barrier layer wherein the second donor/barrier layer includes a Group III–V material having a Group III material with an aluminum concentration between about 23% and about 40%. The structure can further include a selectively-etchable contact layer (e.g., $In_wGa_{1-w}As$) over the second donor/barrier layer.

In another aspect, the invention features a high electron mobility transistor structure including a GaAs substrate having a substrate lattice constant, a graded layer over the substrate and having a graded lattice constant, a first relaxed buffer layer over the graded layer and having a third lattice constant, a second relaxed buffer layer over the first relaxed buffer layer and having a fourth lattice constant substantially equal to the third lattice constant, a first donor/barrier layer over the second relaxed buffer layer (e.g., $(AlGa)_nIn_{1-n}P$) and having a fifth lattice constant, and a channel layer over the first donor/barrier layer and having a sixth lattice constant. The graded layer has a first lattice constant near a bottom of the graded layer substantially equal to the substrate lattice constant and a second lattice constant near a top of the graded layer different than the first lattice constant. The first relaxed buffer layer includes a Group III–V material comprising arsenic, and the second relaxed buffer layer includes a Group III–V material comprising phosphorus. The fourth lattice constant is intermediate the fifth and sixth lattice constants. The structure can further include over the channel layer a second donor/barrier layer wherein the second donor/barrier layer includes a Group III–V material having a Group III material having an aluminum concentration between about 23% and about 40%. The structure can further include a selectively-etchable contact layer (e.g., $In_wGa_{1-w}As$) over the second donor/barrier layer.

Embodiments of the invention may include one or more of the following features. The fourth lattice constant is larger than the fifth lattice constant. The graded layer comprises a Group III–V material includes arsenic, e.g. $(AlGa)_xIn_{1-x}As$, where x is between about 0.6 and about 1. The graded layer includes a Group III–V material having a Group III material with a first concentration of indium at the bottom of the graded layer lower than a second indium concentration at the top of the graded layer, and the first relaxed buffer layer includes a Group III–V material having a Group III material having a third indium concentration lower than the second indium concentration. The difference between the second and third indium concentrations is between about 3 percentage points and about 8 percentage points. The first donor/barrier layer includes a Group III–V material having a Group III material having an aluminum concentration between about 23% and about 40%.

With these configurations, the structures can be formed with either one or two arsenic/phosphorus (As/P) interfaces that are not in the high field regions of structures. Forming these interfaces remote from the high field region can lead to better performance of a structure because formation of abrupt, defect-free As/P interfaces can be difficult and defects at these interfaces can provide a leakage path between a gate and a drain that can lead to premature breakdown of the structure.

As used herein, "$(AlGa)_x$" means $Al_x$, $Ga_x$, or $Al_yGa_{x-y}$. For example, $(AlGa)_{0.25}In_{0.75}P$ means $Al_{0.25}In_{0.75}P$, $Ga_{0.25}In_{0.75}P$, or $Al_yGa_{0.25-y}In_{0.75}P$, where $0 \leq y \leq 0.25$.

Other features, objects, and advantages of the invention will be apparent from the description and drawings, and from the claims.

DETAILED DESCRIPTION

Figure 1:
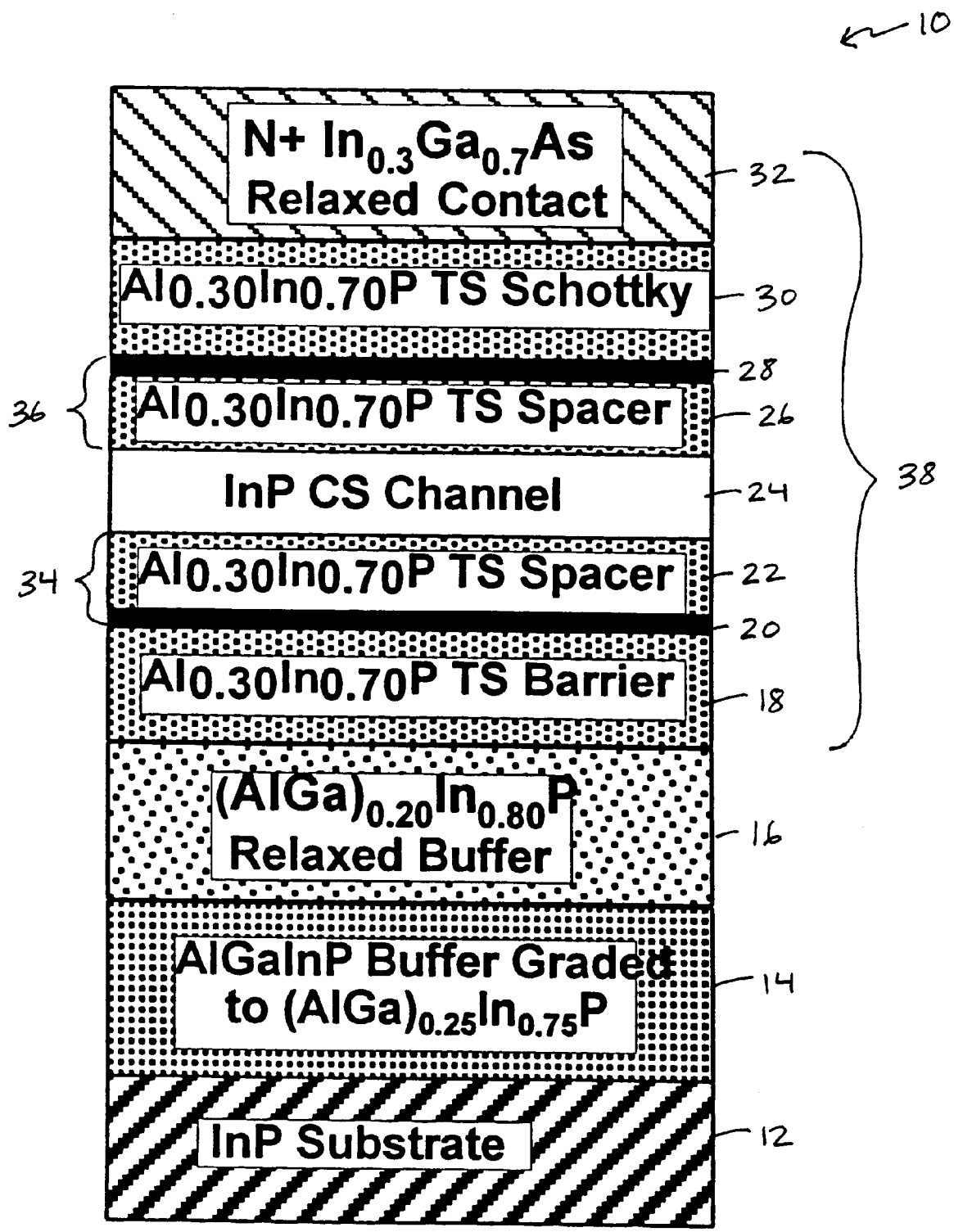
FIG. 1 is a cross-sectional diagrammatical view of a semiconductor structure.

Referring to FIG. 1, a double pulse doped semiconductor structure 10 is shown. Structure 10 includes an InP substrate 12, an undoped buffer graded layer 14 graded from approximately $(AlGa)_{0.05}In_{0.95}P$ to $(AlGa)_{0.25}In_{0.75}P$, an undoped $(AlGa)_{0.20}In_{0.80}P$ relaxed buffer layer 16, an undoped $Al_{0.30}In_{0.70}P$ barrier layer 18, a first pulse doped layer 20, a first undoped $Al_{0.30}In_{0.70}P$ spacer layer 22, an undoped InP channel layer 24, a second undoped $Al_{0.30}In_{0.70}P$ spacer layer 26, a second pulse doped layer 28, an undoped $Al_{0.30}In_{0.70}P$ Schottky-donor/barrier layer 30, and an n+ doped $In_{0.30}Ga_{0.70}As$ relaxed contact layer 32.

First pulse layer 20 and first spacer layer 22 form a first donor-spacer layer 34, and second pulse layer 28 and second spacer layer 26 form a second donor-spacer layer 36. Donor-spacer layers 34 and 36 form heterojunctions with channel layer 24. Layers 18, 20, 22, 24, 26, 28, 30 and 32 together form device layers 38.

Generally, buffer graded layer 14 and relaxed buffer 16 are formed on substrate 12 to provide a "new substrate" having a lattice constant different than the lattice constant of InP substrate 12 so that device layers 38 can be formed on top thereof. Generally, Al-P and Ga-P bonds are shorter than In-P bonds. Therefore, for $(AlGa)_{1-x}In_xP$, the higher the value of x, the larger the lattice constant. Accordingly, the lattice constant of the new substrate, i.e., that of $(AlGa)_{0.20}In_{0.80}P$, is smaller than or contracted from the lattice constant of InP substrate 12. The value of the lattice constant of $(AlGa)_{0.20}In_{0.80}P$ (of relaxed buffer layer 16) is also between the values of the lattice constants of InP (of channel layer 24) and $Al_{0.30}In_{0.70}P$ (of barrier layer 18 and spacer layer 22). More particularly, the lattice constant of $(AlGa)_{0.20}In_{0.80}P$ is larger than the lattice constant of $Al_{0.30}In_{0.70}P$ and smaller than the lattice constant of InP. Having the $(AlGa)_{0.20}In_{0.80}P$ relaxed buffer layer 16 as the new substrate with an intermediate lattice constant (between $Al_{0.30}In_{0.70}P$ and InP) allows formation of pseudomorphic InP channel layer 24 of practical thickness (~110 Å), and pseudomorphic donor-spacer layers 34 and 36 and barrier layers 18 and 30 of practical thickness having relatively high aluminum concentrations, which, as described above, provides structure 10 with good performance.

Without wishing to be bound to any theories, it is believed that when the $Al_{0.30}In_{0.70}P$ barrier layer 18 and the $Al_{0.30}In_{0.70}P$ donor-spacer 34 are formed over the relaxed buffer layer 16, tensile strain ("TS") develops in the barrier layer 18 and the donor-spacer layer 34. This is because the lattice constant of $Al_{0.30}In_{0.70}P$ is smaller than the lattice constant of $(AlGa)_{0.20}In_{0.80}P$ of relaxed buffer layer 16. Layers 18 and 34 are grown relatively thin so that they can elastically strain (pseudomorphic) without forming device-degrading dislocations. When the InP channel layer 24 is deposited over the donor-spacer layer 34, compressive strain ("CS") develops in the channel layer 24. This is because the lattice constant of InP is larger than the lattice constant of $Al_{0.20}In_{0.80}P$ of relaxed buffer layer 16. However, the tensile strain in the donor-spacer layer 34 and barrier layer 18 and the compressive strain in channel layer 24 compensate for each other, yielding a net strain that is close to equilibrium or substantially zero, which allows device layers 38 to be formed.

Buffer graded layer 14, termed metamorphic, is a Group III–V material having a graded indium concentration. Generally, the indium concentration is graded such that, at the bottom of graded layer 14, the lattice constant substantially matches the lattice constant of the InP substrate 12, and at the top of graded layer 14, the lattice constant "undershoots" or "overshoots" (described below) the lattice constant of relaxed buffer layer 16. The thickness of graded layer 14 depends on the desired indium concentration in the relaxed buffer layer 16 (described below) and the rate of change of indium concentration in graded layer 14. Here, graded layer 14 is about 1–2 µm, preferably about 1.2 µm. The indium concentration refers to the ratio (e.g., percentage) of indium atoms to the total amount of Group III elements (e.g., Al, Ga, In) in a given material (e.g., a Group III–V material). At the bottom of graded layer 14, the indium concentration is near 1.00 or 100% (e.g., 0.95), which corresponds approximately to InP. The indium concentration decreases, e.g., linearly, with the thickness of graded layer 14 until a predetermined indium concentration is reached at the top of graded layer 14. For structure 10, the predetermined indium concentration is 0.75 (or 75%), which corresponds to $(AlGa)_{0.25}In_{0.75}P$. As the indium concentration is decreasing, the concentration of aluminum and/or gallium is increasing. Here, the concentration of aluminum and/or gallium is increasing from near zero to 0.25 (or 25%). Furthermore, because aluminum-to-phosphorus bonds and gallium-to-phosphorus bonds are shorter than indium-to-phosphorus bonds, alloying aluminum and/or gallium into InP contracts the lattice constant. Thus, the lattice constant of graded layer 14 decreases from the bottom to the top of layer 14. At the bottom of graded layer 14, the lattice constant is about 5.85 Å, while at the top of graded layer 14, the lattice constant is about 5.77 Å.

During the metamorphic grading process, crystalline defects (e.g., dislocations) can be formed as the graded layer 14 relaxes to a smaller lattice constant. These defects are predominantly in graded layer 14 and are not in the critical device layers 38. However, there can still be residual strain in graded layer 14. To minimize this residual strain, the graded layer 14 is graded such that the indium concentration at the top of graded layer 14 "undershoots" the indium concentration in relaxed buffer layer 16. Here, at the top of graded layer 14, the indium concentration of graded layer 14 is about 3–8 percentage points, preferably 5 percentage points, lower than a desired indium concentration in relaxed buffer layer 16. Undershooting the indium concentration in the relaxed buffer layer 16 produces additional dislocations and defects in graded layer 14 that further relieve or relax most or substantially all of the strain associated with grading. Most of the dislocations in graded layer 14, however, occur near substrate 12, which helps to ensure that the dislocations do not affect the performance of structure 10.

Relaxed buffer layer 16 is a layer substantially free of strain, i.e., it is relaxed. Relaxed buffer layer 16 has an unstrained, natural lattice constant of about 5.785 Å. Layer 16 is about 1,000–2,000 Å thick. Thus, by using graded layer 14 and relaxed buffer layer 16, device layers 38 can be formed on a new, strain-free "substrate" (relaxed buffer layer 16) having a lattice constant different than the lattice constant of InP substrate 12.

Barrier layer 18 is grown thin, about 250 Å, so that it can strain elastically when grown on relaxed buffer layer 16. First pulse layer 20 has a silicon sheet concentration of about $1 \times 10^{12} - 2 \times 10^{12}$ cm$^{-2}$. First spacer layer 22 has a thickness of about 30–60 Å. As described above, because of the difference in indium concentrations, the natural lattice constants of layers 18 and 22 and relaxed buffer layer 16 are different; relaxed buffer layer 16 has a larger lattice constant than the natural lattice constants of layers 18 and 22. Accordingly, barrier layer 18 and spacer layer 22 are tensilely and elastically strained when deposited over relaxed buffer layer 16.

Pseudomorphic InP channel layer 24, when deposited over spacer layer 22, is compressively strained because the natural lattice constant of channel layer 24 is larger than the lattice constant of relaxed buffer layer 16. This compressive strain is compensated by the underlying tensile strain. The net strain of channel layer 24 and barrier and spacer layers 18 and 22 is essentially close to equilibrium.

Second spacer layer 26, second pulse layer 28, and Schottky layer 30 are generally as described for first spacer layer 22, first pulse layer 20, and barrier layer 18, respectively. As with first spacer and barrier layers 22 and 18, second spacer and Schottky layers 26 and 30 are tensilely strained because the natural lattice constants of second spacer and Schottky layers 26 and 30 are smaller than the lattice constant of relaxed buffer layer 16. The strain in second spacer and Schottky layers 26 and 30 are not compensated by other layers. Rather, layers 26 and 30 are formed thin, e.g., about 100–200 Å, so that they do not dislocate or affect the performance of structure 10.

Layer 32 is a contact layer having a composition of $In_{0.30}Ga_{0.70}As$, which closely lattice matches relaxed buffer layer 16. Also, compared to $Al_{0.30}In_{0.70}P$ with a bandgap of about 2.03 eV, the relatively small bandgap of $In_{0.30}Ga_{0.70}As$ (1.1 eV) facilitates contact formation. Furthermore, known selective etches can be used to remove the arsenide (contact) layer on top of the phosphide (Schottky) layer for process uniformity and control of the critical gate formation. Because this layer is removed before gate fabrication, the arsenide-phosphide interface (which may have defects) is not in the high field regions of the device.

Figure 2:
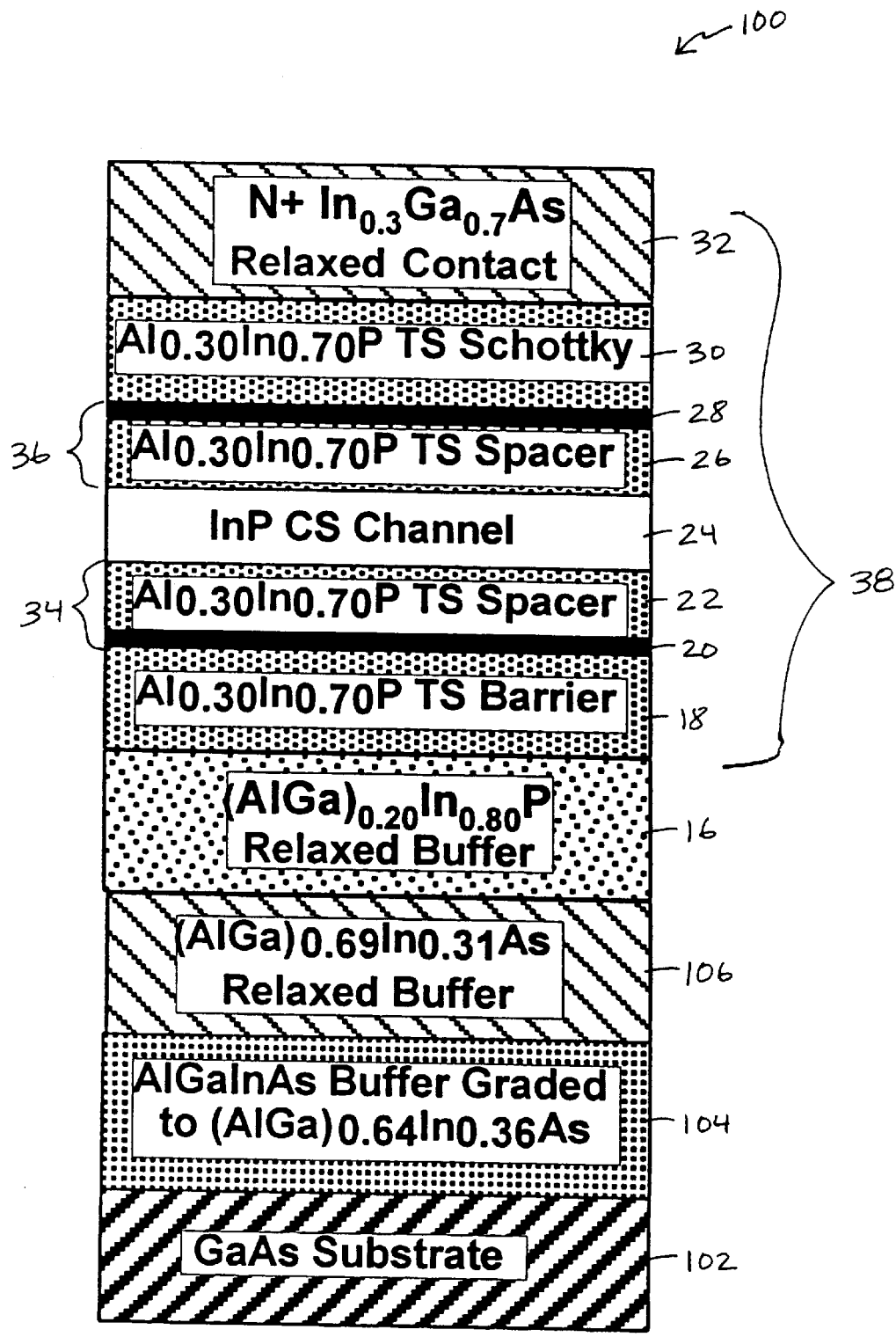
FIG. 2 is a cross-sectional diagrammatical view of a semiconductor structure.

Referring to FIG. 2, in another embodiment of the invention, structure 100 includes a GaAs substrate 102, a buffer graded layer 104 graded from about $(AlGa)_{0.05}In_{0.95}As$ to about $(AlGa)_{0.64}In_{0.36}As$, an $(AlGa)_{0.69}In_{0.31}As$ relaxed buffer layer 106, $(AlGa)_{0.20}In_{0.80}P$ relaxed buffer layer 16, $Al_{0.30}In_{0.70}P$ barrier layer 18, first pulse layer 20, first $Al_{0.30}In_{0.70}P$ spacer layer 22, InP channel layer 24, second $Al_{0.30}In_{0.70}P$ spacer layer 26, second pulse layer 28, $Al_{0.30}In_{0.70}P$ Schottky/barrier layer 30, and $In_{0.30}Ga_{0.70}As$ relaxed contact layer 32. Generally, while InP substrate 12 is used for high power dissipation applications because of its high thermal conductivity, GaAs substrates are used for relatively low cost, high volume manufacturing applications.

Structure 100 is generally similar to structure 10 but includes a GaAs substrate 102 and layers 104 and 106. Accordingly, to change the lattice constant of the substrate on which device layers 38 are formed, structure 100 includes a metamorphic, graded $(AlGa)_xIn_{1-x}As$ layer 104 and a $(AlGa)_yIn_{1-y}As$ relaxed buffer layer 106. With this configuration, structure 100 can be formed with two arsenic/phosphorus (As/P) interface that are not in the high field regions of structure 100.

Graded layer 104 is graded from GaAs at the bottom of layer 104 to $(AlGa)_{0.64}In_{0.36}As$ at the top of layer 104. That is, the indium concentration increases with increasing distance from substrate 102. Because indium-arsenic bonds are longer than aluminum-arsenic and gallium-arsenic bonds, the lattice constant of graded layer 104 increases with increasing distance from substrate 102. Typically, graded layer 104 is about 1 $\mu$m to about 2 $\mu$m thick. Similar to graded layer 14, the indium concentration of graded layer 104 overshoots the indium concentration of relaxed buffer layer 106 by about 3–8 percentage points, preferably about 5 percentage points. Again, overshooting puts defects and dislocations into the lattice of graded layer 104 to minimize residual strain formed from grading layer 104.

First relaxed buffer layer 106 is a strain-free layer of $(AlGa)_{0.69}In_{0.31}As$ having a lattice constant different than the lattice constant of substrate 102. More specifically, the lattice constant of first relaxed buffer layer 106 is between that of barrier layer 18 and channel layer 24. First relaxed buffer layer 106 is typically about 500 Å thick.

Disposed over first relaxed layer 106 is second relaxed layer 16 having a composition of $(AlGa)_{0.20}In_{0.80}P$. The lattice constants of first and second relaxed layers 106 and 16 are lattice matched, i.e., the lattice constants are substantially the same. It should be noted that forming layer 16 over layer 106 forms one As/P interface. This interface, however, is remote from device layers 38 to minimize adverse effects from defects that may have been formed at the interface.

Relaxed buffer layer 16, barrier layer 18, first pulse layer 20, first spacer layer 22, InP channel layer 24, second spacer layer 26, second pulse layer 28, Schottky/barrier layer 30, and relaxed contact layer 32 are generally as described above for structure 10.

Figure 3:
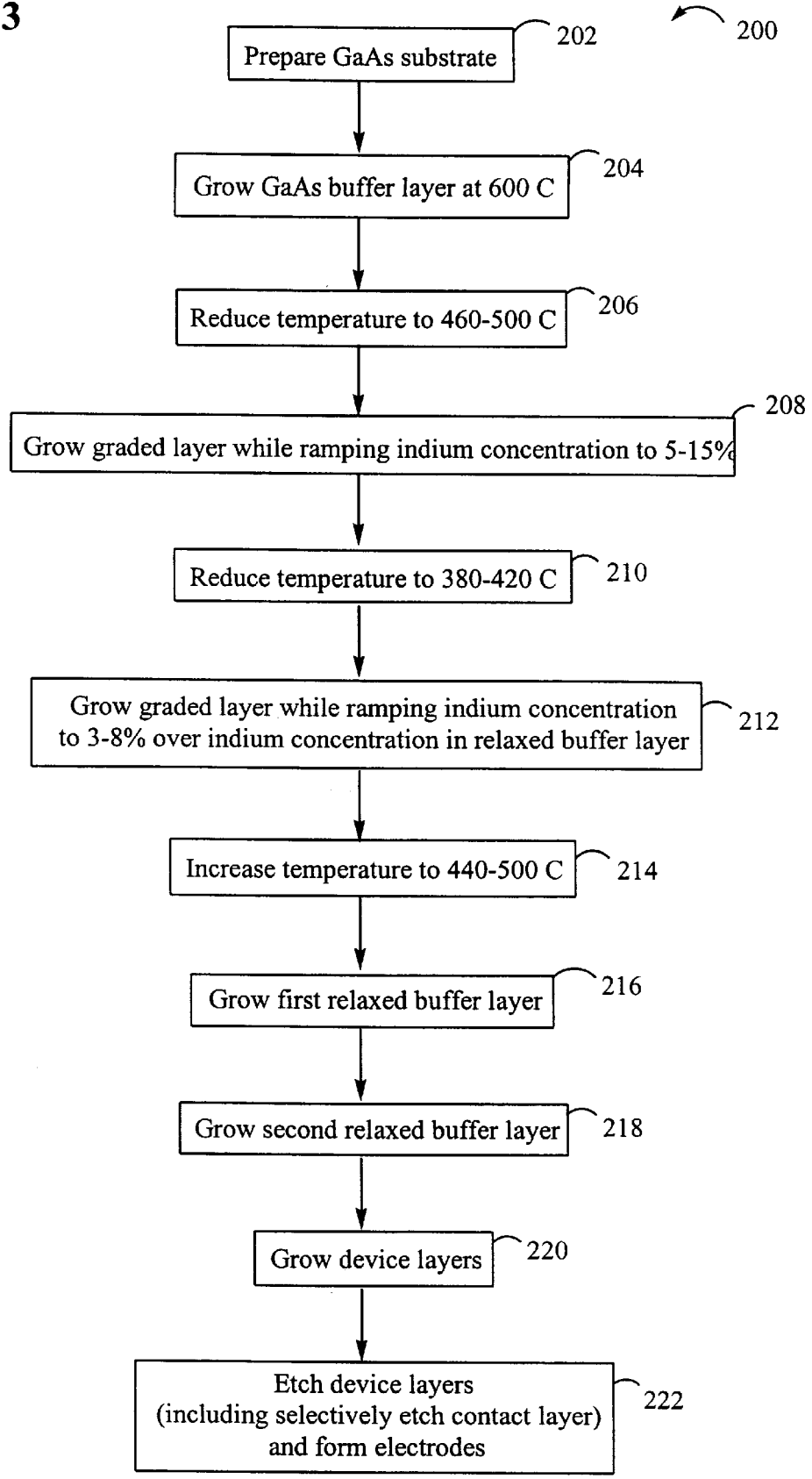
FIG. 3 is a flow diagram of a method of making a HEMT.
Figure 4:
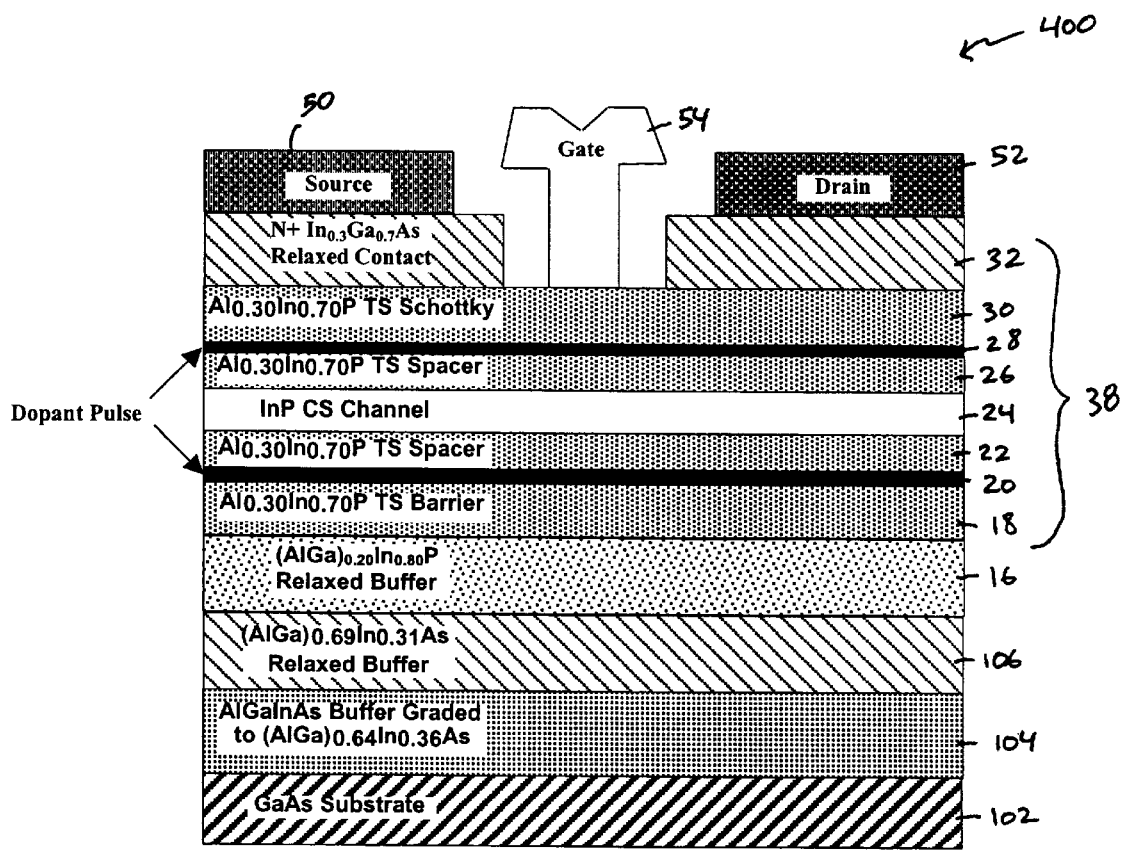
FIG. 4 is a cross-sectional diagrammatical view of a HEMT.

Referring to FIGS. 3 & 4, a method 200 of making HEMT 400, based on structure 100, is shown. Method 200 uses molecular beam epitaxy (MBE) to deposit/grow materials on top of existing materials in a deposition chamber. Generally, a substrate 102 is provided and prepared (Steps 202, 204, 206); graded layer 104 is grown (Steps 208, 210, 212); first relaxed buffer layer 106 is grown (Steps 214 and 216); second relaxed buffer layer 16 is grown (Step 218); device layers 38 are grown (Step 220) and etched (Step 222); and Ohmic contacts and Schottky contact are formed (Step 222).

More particularly, GaAs substrate 12 is prepared (Step 202) by desorbing oxide from substrate 102 and growing additional layers of GaAs to smooth the surface of substrate 102. Oxide is desorbed from substrate 102 at about 640° C. in an arsenic overpressure using conventional techniques. GaAs is then deposited (Step 204) at a temperature of about 560–600° C. to a thickness of about 100–400 Å, preferably about 100 Å, to help provide a smooth, clean top surface of GaAs. A 5–10 period AlGaAs/GaAs superlattice is formed at about 560–600° C. over the deposited GaAs. Each period includes about 20–40 Å of GaAs and 20–40 Å of $Al_yGa_{1-y}$As, where $0.2 \leq y \leq 1.0$. This superlattice helps prevent propagation of substrate defects (e.g., dislocations) into buffer graded layer 104. More GaAs is grown over the superlattice at about 560–600° C. to a thickness of less than about 1,000 Å, and preferably about 500 Å.

The temperature of the wafer is reduced to between about 460° C. and about 500° C. (Step 206) and a portion of first graded buffer layer 104 is grown (Step 208). Buffer graded layer 104 is grown (Step 208) starting with $In_{0.05}(Al_wGa_{1-w})_{0.95}As$. The indium concentration is initially less than about 15% to guard against three-dimensional (nonplanar) growth. As graded layer 104 begins growing, more indium is introduced into the material being deposited so that the indium concentration increases, e.g., linearly, with time and with the thickness of graded layer 104. For $In_x(AlGa)_{1-x}As$, as the indium concentration is increased, the aluminum and gallium concentrations are adjusted (aluminum being ramped up and gallium being ramped down) to help ensure that graded layer 104 remains insulating and that the bandgap of graded layer 104 remains greater than the bandgap of GaAs substrate 102. The indium concentration is increased to an intermediate concentration between 10–20%, and preferably about 15–18%.

When the indium concentration in graded layer 104 reaches the intermediate concentration, the temperature is reduced (Step 210) for more graded layer growth (Step 212). The temperature is reduced (Step 210) to between about 380 and about 420° C. Graded layer 104 may be grown during the time needed to reduce (Step 210) the temperature or a growth interrupt may occur during temperature reduction. With the temperature reduced (Step 210), graded layer 104 is continued to be grown (Step 212). The reduced temperature helps reduce 3-dimensional growth, yielding substantially planar growth of graded layer 104. The indium concentration is increased, e.g., linearly, while growing (Step 212) graded layer 104 from a thickness at the intermediate concentration until the indium concentration in graded layer 104 reaches the predetermined maximum concentration at the top of buffer layer 104.

When the maximum desired indium concentration is reached, the temperature is increased (Step 214) for growing first relaxed layer 106 (Step 216). The temperature is increased (Step 214) to between about 440 and about 500° C. First relaxed layer 106 may be grown during the time needed to increase (Step 214) the temperature or a growth interrupt may occur during temperature increase (Step 214). With the temperature raised (Step 214), first relaxed layer 106 is grown (Step 216) with the indium concentration adjusted to the desired relaxed indium concentration.

While maintaining the same temperature, second relaxed buffer layer 16 is grown (Step 18) by terminating the arsenic flux and starting a phosphorus flux. Second relaxed buffer layer 16 is grown with the indium, aluminum, and gallium concentrations adjusted to the desired concentrations for layer 16.

Device layers 38 are grown (Step 220) and etched (Step 222), and electrodes (not shown) are formed (Step 222). Device layers are grown (Step 220) at temperatures between about 460 and about 520° C. using conventional techniques. Generally, the compositions of $Al_xIn_{1-x}P$ and $(AlGa)_xIn_{1-x}As$ layers are calibrated by first growing thin, pseudomorphic test layers of $Al_xIn_{1-x}P$ and $(AlGa)_xIn_{1-x}As$ on top of GaAs or InP by MBE under known growth conditions. The test layers are characterized by X-ray diffraction to determine their elastically-strained lattice constants, which are then matched with known values for $Al_xIn_{1-x}P$ and $(AlGa)_xIn_{1-x}As$. Accordingly, the determined compositions of $Al_xIn_{1-x}P$ and $(AlGa)_xIn_{1-x}As$ can be matched with the known growth conditions to reproducibly form layers of $Al_xIn_{1-x}P$ and $(AlGa)_xIn_{1-x}As$ with known compositions and lattice constants. Techniques for forming device layers 38 are known and generally described in W. E. Hoke et al., "Solid Source Molecular Beam Epitaxial Growth of $Ga_{0.5}In_{0.5}P$ Using a Valved, Three-Zone Phosphorus Source" *J. Vac. Sci. Tech-* nol. B13, 733, 1995; and W. E. Hoke et al., "Practical Aspects of Solid Source Molecular Beam Epitaxial Growth of Phosphorus-Containing Films" *J. Vac. Sci. Technol.* B17, 2009, 1999, all hereby incorporated by reference. A recess is formed (Step 222) through contact layer 32 for a gate electrode using a selective succinic acid based wet etch. Source and drain electrodes 50 and 52 are formed (Step 222) using alloyed AuGe-Au metallurgy. The gate electrode 54 is formed from Ti-Pt-Au as a 0.15 µm–0.25 µm T-gate using conventional techniques to complete HEMT 400.

Figure 5:
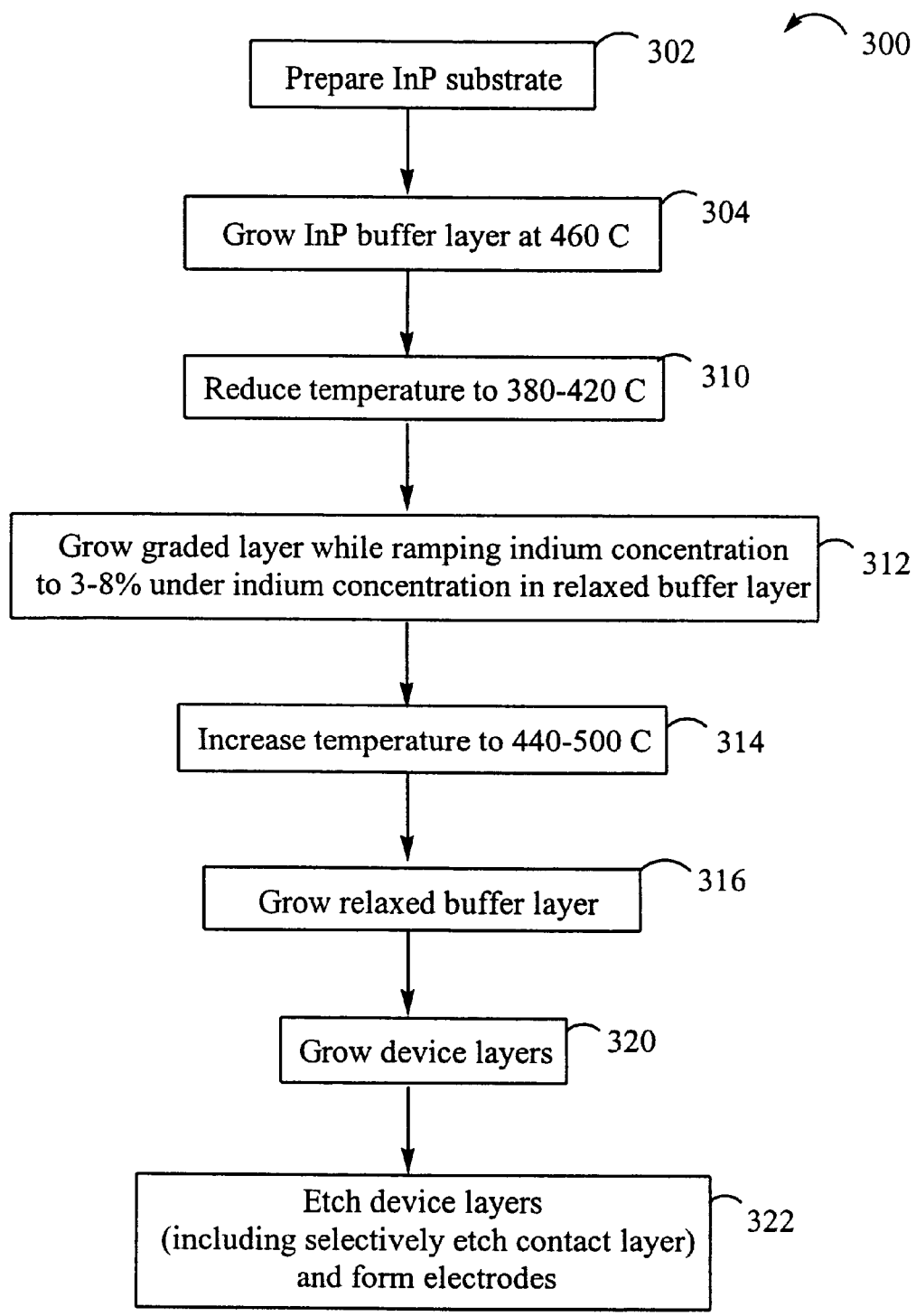
FIG. 5 is a flow diagram of a method of making a HEMT.
Figure 6:
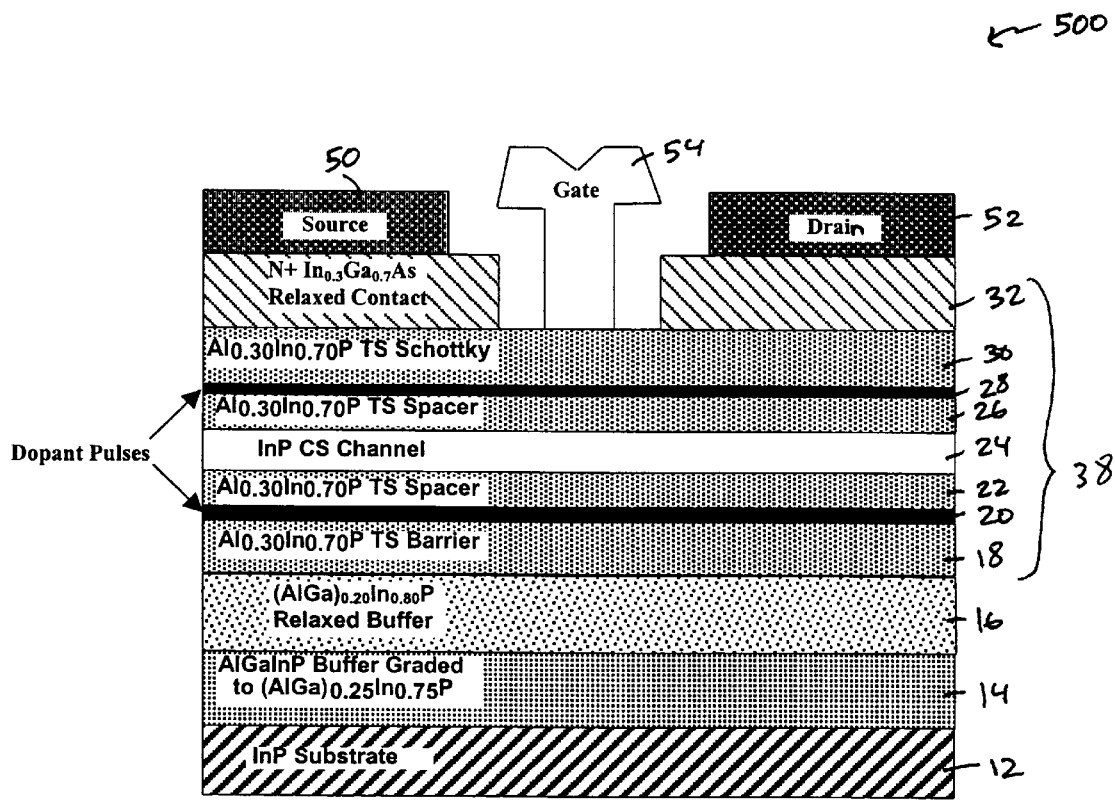
FIG. 6 is a cross-sectional diagrammatical view of a HEMT.

Referring to FIGS. 5 & 6, a method 300 of making HEMT 500, based on structure 10, is shown. Method 300 uses standard MBE techniques to grow materials generally the same as method 200. Generally, substrate 12 is provided and prepared (Steps 302, 304); graded layer 14 is grown (Steps 310, 312); relaxed buffer layer 16 is grown (Steps 314, 316); device layers 38 are grown (Step 320) and etched (Step 322); and Ohmic contacts and Schottky contact are formed (Step 322).

While certain embodiments have been described, other embodiments are contemplated. For example, while certain layers of structure 10 and 100 are described above with specific compositions, such as $Al_{0.30}In_{0.70}P$, $(AlGa)_{0.20}In_{0.80}P$, and $(AlGa)_{0.69}In_{0.31}As$, it should be recognized that other general compositions may be used for graded layers 14 and 104, relaxed buffer layers 16 and 106, donor/barrier layers and channel layers. Generally, the compositions provide for metamorphic growth of the graded layers and strain compensation of layers disposed over the graded layers.

Also, while graded layers 14 and 104 are described above as having linearly decreasing and increasing indium concentrations, respectively, the indium concentrations can be graded non-linearly. For example, the indium concentrations can be graded stepwise. Graded layers 14 and 104 may be made of a plurality of layers, and each successive layer may have an increasing or decreasing indium concentration, e.g., 5–13%.

Other embodiments are within the claims.

What is claimed is:

1. A semiconductor structure, comprising:
   a substrate having a substrate lattice constant;
   a graded layer over the substrate and having a graded lattice constant, the graded layer having a first lattice constant near a bottom of the graded layer substantially equal to the substrate lattice constant and a second lattice constant near a top of the graded layer different than the first lattice constant;
   a first donor/barrier layer over the graded layer and having a third lattice constant; and
   a channel layer over the first donor/barrier layer and having a fourth lattice constant,
   wherein the second lattice constant is intermediate the third and fourth lattice constants.

2. The structure of claim 1, wherein the second lattice constant is smaller than the first lattice constant.

3. The structure of claim 1, wherein the second lattice constant is larger than the third lattice constant.

4. The structure of claim 1, wherein the first donor/barrier layer is tensilely strained.

5. The structure of claim 1, wherein the channel layer is compressively strained.

6. The structure of claim 1, wherein the first donor/barrier layer is tensilely strained, the channel layer is compressively strained, and strains in the first donor/barrier layer and the channel layer are substantially at equilibrium.

7. The structure of claim 1, wherein the lattice constant of a portion of the graded layer varies with distance from the substrate.

8. The structure of claim 1, wherein the graded layer comprises a Group III–V material including a Group III material having a first concentration of indium at the bottom of the graded layer higher than a second indium concentration at the top of the graded layer.

9. The structure of claim 8, wherein the graded layer comprises $(AlGa)_{0.25}In_{0.75}P$.

10. The structure of claim 1, wherein the graded layer has a linearly varying indium concentration.

11. The structure of claim 1, wherein the graded layer has a stepwise varying indium concentration.

12. The structure of claim 1, further comprising a relaxed buffer layer over the graded layer and having a fifth lattice constant intermediate the third and fourth lattice constants.

13. The structure of claim 12, wherein the fifth lattice constant is larger than the third lattice constant.

14. The structure of claim 12, wherein the graded layer comprises a Group III–V material including a Group III material having a first concentration of indium at the bottom of the graded layer higher than a second indium concentration at the top of the graded layer, and the relaxed buffer layer comprises a Group III–V material including a Group III material having a third indium concentration higher than the second indium concentration.

15. The structure of claim 14, wherein the difference between the second and third indium concentrations is between about 3 percentage points and about 8 percentage points.

16. The structure of claim 15, wherein the difference between the second and third indium concentrations is about 5 percentage points.

17. The structure of claim 12, wherein the relaxed buffer layer comprises $(AlGa)_{0.20}In_{0.80}P$.

18. The structure of claim 1, wherein the graded layer comprises a Group III–V material including a Group III material having a first concentration of indium at the bottom of the graded layer higher than a second indium concentration at the top of the graded layer, and the first donor/barrier layer comprises a Group III–V material including a Group III material having a fourth indium concentration lower than the second indium concentration.

19. The structure of claim 1, wherein the first donor/barrier layer comprises a Group III–V material including a Group III material having an aluminum concentration between about 23% and about 40%.

20. The structure of claim 19, wherein the first donor/barrier layer comprises $Al_{0.30}In_{0.70}P$.

21. The structure of claim 1, wherein the channel layer comprises InP.

22. The structure of claim 21, wherein the channel layer has a thickness of about 80 Å to about 130 Å.

23. The structure of claim 1, further comprising a second donor/barrier layer over the channel layer.

24. The structure of claim 23, wherein the second donor/barrier layer comprises a Group III–V material including a Group III material having an aluminum concentration between about 23% and about 40%.

25. The structure of claim 24, wherein the second donor/barrier layer comprises $Al_{0.30}In_{0.70}P$.

26. The structure of claim 23, further comprising a selectively-etchable contact layer over the second donor/barrier layer.

27. The structure of claim 26, wherein the contact layer comprises arsenic.

28. The structure of claim 1, wherein the structure is a portion of a high electron mobility transistor.

29. A high electron mobility transistor structure, comprising:
- an InP substrate having a substrate lattice constant;
- an $(AlGa)_x In_{1-x}P$ graded layer over the substrate and having a graded lattice constant, the graded layer having a first lattice constant near a bottom of the graded layer substantially equal to the substrate lattice constant and a second lattice constant near a top of the graded layer different than a first lattice constant;
- an $(AlGa)_y In_{1-y}P$ relaxed buffer layer over the graded layer and having a lattice constant, the lattice constant of the relaxed buffer layer greater than the second lattice constant;
- a first $Al_z In_{1-z}P$ donor/barrier layer, wherein $0.23 \leq z \leq 0.40$, over the relaxed buffer layer and having a lattice constant; and
- an InP channel layer over the donor/barrier layer and having a lattice constant, wherein the lattice constant of the relaxed buffer layer is intermediate the lattice constants of the first donor/barrier layer and the channel layer.

30. The structure of claim 29, further comprising a second $Al_z In_{1-z}P$ donor/barrier layer over the channel layer, wherein $0.23 \leq z \leq 0.40$.

31. The structure of claim 30, further comprising an $In_w Ga_{1-w}As$ contact layer over the second donor/barrier layer.

* * * * *

UNITED STATES PATENT AND TRADEMARK OFFICE
CERTIFICATE OF CORRECTION

PATENT NO. : 6,489,639 B1  
DATED : December 3, 2002  
INVENTOR(S) : Hoke et al.

Page 1 of 1

It is certified that error appears in the above-identified patent and that said Letters Patent is hereby corrected as shown below:

Column 6,  
Line 57, delete "$Al_{0\ 30}In_{0.70}P$" and replace with -- $Al_{0.30}In_{0.70}P$ --.

Column 7,  
Line 49, delete "Ohmic contacts and Schottky contact" and replace with -- Ohmic contacts and Schottky contacts --.

Column 8,  
Line 53, delete "$(AlGa)_xIn_{1-}As$" and replace with -- $(AlGa)_xIn_{1-x}As$ --.

Column 9,  
Line 18, delete "Ohmic contacts and Schottky contact" and replace with -- Ohmic contacts and Schottky contacts --.

Signed and Sealed this

Twenty-seventh Day of January, 2004

JON W. DUDAS  
*Acting Director of the United States Patent and Trademark Office*